United States Patent
Choi

(10) Patent No.: US 9,647,245 B2
(45) Date of Patent: May 9, 2017

(54) FLEXIBLE ORGANIC ELECTROLUMINESCENT DEVICE AND METHOD OF FABRICATING THE SAME

(71) Applicant: LG Display Co., Ltd., Seoul (KR)

(72) Inventor: Nack Bong Choi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/942,958

(22) Filed: Nov. 16, 2015

(65) Prior Publication Data

US 2016/0072102 A1 Mar. 10, 2016

Related U.S. Application Data

(62) Division of application No. 14/445,170, filed on Jul. 29, 2014, now Pat. No. 9,219,102.

(30) Foreign Application Priority Data

Jul. 30, 2013 (KR) .................. 10-2013-0090399

(51) Int. Cl.
| | | |
|---|---|---|
| H01L 51/56 | (2006.01) |
| H01L 27/32 | (2006.01) |
| H01L 51/00 | (2006.01) |
| H01L 29/04 | (2006.01) |
| H01L 29/16 | (2006.01) |
| H01L 29/66 | (2006.01) |
| H01L 51/52 | (2006.01) |

(52) U.S. Cl.
CPC .......... *H01L 51/56* (2013.01); *H01L 27/3258* (2013.01); *H01L 27/3262* (2013.01); *H01L 29/04* (2013.01); *H01L 29/16* (2013.01); *H01L 29/66757* (2013.01); *H01L 51/0097* (2013.01); *H01L 51/5253* (2013.01); *H01L 2227/323* (2013.01); *H01L 2251/5338* (2013.01); *Y02E 10/549* (2013.01)

(58) Field of Classification Search
USPC ..... 257/E33.064, E51.005, E51.018, 40, 59, 257/60, 72; 349/147; 438/149
See application file for complete search history.

(56) References Cited

U.S. PATENT DOCUMENTS

| | | | |
|---|---|---|---|
| 4,889,411 A | 12/1989 | Parks et al. |
| 6,046,547 A | 4/2000 | Nishio et al. |
| 6,420,200 B1 | 7/2002 | Yamazaki et al. |
| 7,476,908 B2 | 1/2009 | Yamazaki et al. |
| 7,501,653 B2 | 3/2009 | Arai et al. |
| 7,687,984 B2 | 3/2010 | Seo et al. |
| 8,278,664 B2 | 10/2012 | Hwang et al. |

(Continued)

*Primary Examiner* — Telly Green
(74) *Attorney, Agent, or Firm* — Morgan, Lewis & Bockius LLP

(57) ABSTRACT

A flexible organic electroluminescent device is disclosed which includes: a flexible substrate; a buffer layer entirely formed on the flexible substrate; a thin film transistor formed on the buffer layer and configured to include an active layer; a planarization film formed to cover the thin film transistor; an organic light emitting diode formed on the planarization film and configured to include a first electrode, an organic emission layer and a second electrode; and at least one silicon nitride layer formed above the active layer of the thin film transistor but under the planarization film and patterned into a plurality of island patterns.

15 Claims, 6 Drawing Sheets

(56) References Cited

U.S. PATENT DOCUMENTS

| | | | |
|---|---|---|---|
| 8,350,302 B2 | 1/2013 | Lee et al. | |
| 9,059,428 B2 * | 6/2015 | Kim | H01L 51/5237 |
| 2005/0087769 A1 | 4/2005 | Yamazaki et al. | |
| 2005/0179379 A1 | 8/2005 | Kim | |
| 2005/0253171 A1 | 11/2005 | Kang et al. | |
| 2006/0091397 A1 | 5/2006 | Akimoto et al. | |
| 2012/0032263 A1 | 2/2012 | Nakazawa et al. | |
| 2012/0199853 A1 | 8/2012 | Konuma et al. | |
| 2014/0217397 A1 * | 8/2014 | Kwak | H01L 27/1218 257/43 |
| 2014/0252337 A1 | 9/2014 | Konuma et al. | |
| 2014/0284606 A1 | 9/2014 | Lu et al. | |
| 2015/0001475 A1 * | 1/2015 | Kim | H01L 51/5237 257/40 |
| 2015/0008439 A1 | 1/2015 | Yamazaki et al. | |

\* cited by examiner

FLEXIBLE ORGANIC ELECTROLUMINESCENT DEVICE AND METHOD OF FABRICATING THE SAME

This is a divisional application of copending U.S. application Ser. No. 14/445,170, filed Jul. 29, 2014, which claims priority under 35 U.S.C. §119(a) of Korean Patent Application No. 10-2013-00090399 filed on Jul. 30, 2013, both of which are hereby incorporated by reference.

BACKGROUND OF THE INVENTION

Field of the Disclosure

The present application relates to a flexible organic electroluminescent device, and more particularly, to a flexible organic electroluminescent device and a fabrication method thereof to enhance a banding property.

Discussion of the Related Art

The organic electroluminescent device emits light by enabling excitons within an emission layer to transition from an excitation state to a ground (a base) state. The excitons are formed through recombination of electrons and holes which are injected from an electron injection electrode and a hole injection electrodes into the emission layer.

Such an organic electroluminescent device driven in the above-mentioned principle has a self-luminous property. Also, the organic electroluminescent device can reduce thickness and weight because of being unnecessary for a separated light source unlike a liquid crystal display device. Moreover, the organic electroluminescent device has high grade properties such as low consumption power, high brightness, fast response time, and so on. As such, the organic electroluminescent device is being considered as a next generation display device of mobile electrical appliances. Furthermore, the organic electroluminescent device can be fabricated through a simple fabrication procedure. In accordance therewith, the organic electroluminescent device can largely reduce fabrication cost compared to the liquid crystal display device.

Meanwhile, the display devices are required to have flexibility. As such, flexible display devices are being actively researched.

FIG. 1 is a cross-sectional view showing an ordinary flexible organic electroluminescent device. In detail, FIG. 1 is an enlarged cross-sectional view largely showing an organic light emitting diode E and a driving thin film transistor TD.

With reference to FIG. 1, the ordinary flexible organic electroluminescent device includes a switching thin film transistor (not shown) and a driving thin film transistor TD which are formed on a first substrate 100, a planarization film 121 covering the driving thin film transistor TD, and an organic light emitting diode E.

The switching thin film transistor and the driving thin film transistor TD can be formed in one of an edge stopper structure and a coplanar structure. Hereinafter, a driving thin film transistor TD of the coplanar structure will be explained.

The driving transistor TD with the coplanar structure includes: a buffer layer 101 formed on the entire surface of the substrate 100; an active layer 110 formed on the buffer layer 101; a gate insulation film 114 and a gate electrode 115 which are sequentially formed on the active layer 110; and an interlayer insulation film 116 and source and drain electrodes 119a and 119b which are sequentially formed on the gate electrode 115.

The active layer 110 is defined into a channel region 112 and source/drain regions 113 and 111 formed in both ends thereof. The source and drain electrodes 119a and 119b are connected to the source and drain regions 113 and 111 of the active layer 110.

The organic light emitting diode E includes: a first electrode 131 formed on the planarization film 121 opposite to a pixel; an organic emission layer 133 formed in a region of the first electrode which is defined by an organic bank film 132 covering edges of the first electrode 131; and a second electrode 134 formed on the organic emission layer 133.

A sealing layer 140 and a front film 150 are sequentially formed on the second electrode 134 of the organic light emitting diode E.

The active layer 110 can become a polysilicon film which is formed a low temperature polysilicon (LTPS) process. In this case, a hydrogenation process must be performed for the active layer 110. Such a hydrogenation process forces a silicon nitride (SiNx) layer to be formed in an upper or lower portion of the driving transistor TD. However, the silicon nitride (SiNx) layer is easy to crack. Due to this, the silicon nitride (SiNx) layer can cause cracks when a banding process is performed.

SUMMARY OF THE INVENTION

Accordingly, embodiments of the present application are directed to a flexible organic electroluminescent device and a fabrication method thereof that substantially obviate one or more of problems due to the limitations and disadvantages of the related art.

An object of the invention is to provide a flexible organic electroluminescent device and a fabrication method thereof that are adapted to enhance a banding property by patterning a silicon nitride (SiNx) layer, which is easy to crack when a banding process is performed, into pixels.

Additional features and advantages of the embodiments will be set forth in the description which follows, and in part will be apparent from the description, or may be learned by practice of the embodiments. The objectives and other advantages of the embodiments will be realized and attained by the structure particularly pointed out in the written description and claims hereof as well as the appended drawings.

To achieve these and other advantages and in accordance with the purposed of the present invention, as embodied and broadly described, a flexible organic electroluminescent device includes: a flexible substrate; a buffer layer entirely formed on the flexible substrate; a thin film transistor formed on the buffer layer and configured to include an active layer; a planarization film formed to cover the thin film transistor; an organic light emitting diode formed on the planarization film and configured to include a first electrode, an organic emission layer and a second electrode; and at least one silicon nitride layer formed above the active layer of the thin film transistor but under the planarization film and patterned into a plurality of island patterns.

A fabrication method of a flexible organic electroluminescent device according to another general aspect of the present embodiments includes: preparing a flexible substrate; forming a buffer layer on the entire surface of the flexible substrate; forming a thin film transistor, which includes an active layer formed from poly-silicon, on the buffer layer and configured to include an active layer; forming a planarization film on the entire surface of the flexible substrate provided with the thin film transistor; an organic light emitting diode, which includes a first electrode, an organic emission layer and a second electrode, on the planarization film. The formation of the thin film transistor includes forming at least one silicon nitride layer, which is patterned into a plurality of island patterns, above the active layer of the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the embodiments and are incorporated herein and constitute a part of this application, illustrate embodiments of the present invention and together with the description serve to explain the disclosure. In the drawings.

DETAILED DESCRIPTION OF THE EMBODIMENTS

Figure 1:
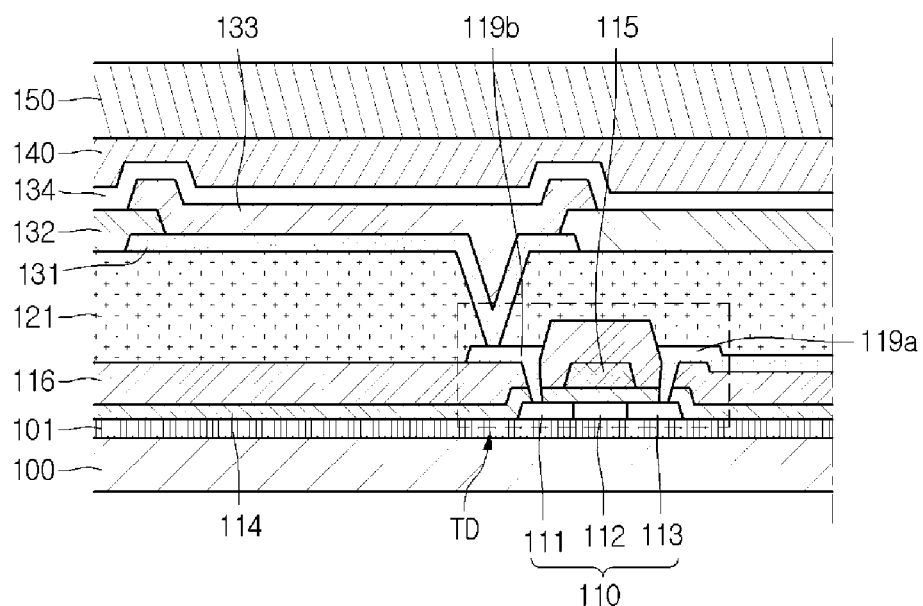
FIG. 1 is a cross-sectional view showing an ordinary flexible organic electroluminescent device.

Reference will now be made in detail to a flexible organic electroluminescent device and a fabrication method thereof according to example embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2A:
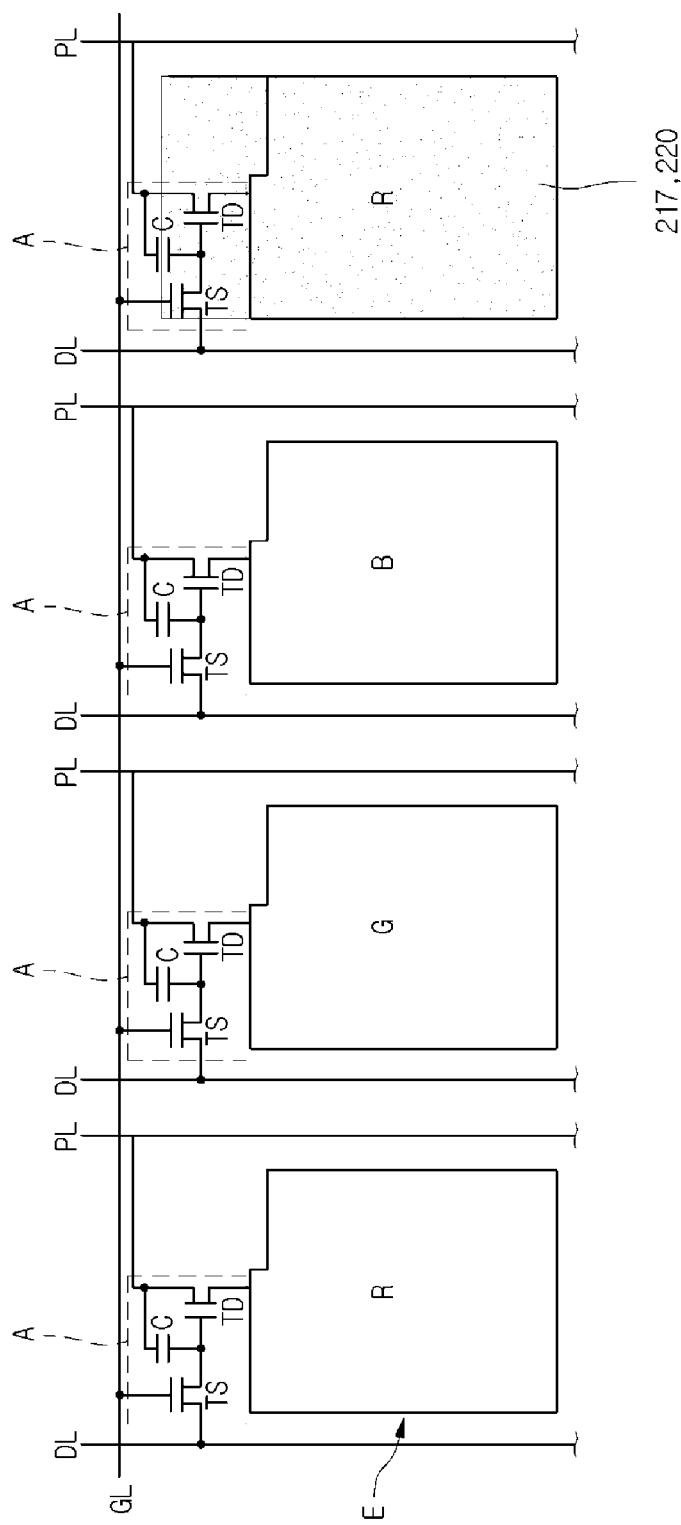
FIG. 2A is a planar view showing a flexible organic electroluminescent device according to a first embodiment of the present disclosure.

FIG. 2A is a planar view showing a flexible organic electroluminescent device according to a first embodiment of the present disclosure. In other words, FIG. 2A is an equivalent circuit diagram showing red, green and blue sub-pixel regions.

With reference to FIG. 2A, a flexible organic electroluminescent device of the present disclosure is defined into a plurality of sub-pixel regions by gate lines GL, data lines DL and power supply lines PL crossing one another.

The plurality of sub-pixel regions includes red, green and blue sub-pixel regions R, G and B. The sub-pixels regions are arranged in a matrix shape and used to display images.

A driving cell A and an organic light emitting diode E are formed in each of the red, green and blue sub-pixel regions R, G and B. The organic light emitting diode E is connected to the driving cell A.

The driving cell A includes a switching thin film transistor TS, a driving thin film transistor TD and a storage capacitor C. The switching thin film transistor TS is connected between the gate line GL and the data line DL. The driving thin film transistor TD is connected between the switching thin film transistor TS, the power supply line PL and the organic light emitting diode E. The storage capacitor C is connected between the power supply line PL and a drain electrode of the switching thin film transistor TS.

A second interlayer insulation film 217 and a passivation film 220 are formed in each of the sub-pixel regions. The second interlayer insulation film 217 and the passivation film 220 are formed from silicon nitride SiNx and patterned into an island pattern opposite to each sub-pixel region. As the silicon nitride films (or layers) easy to crack are patterned into island patterns opposite to the sub-pixel regions, the organic electroluminescent device can have an enhanced banding property. The island pattern shape depends on a respective sub-pixel shape.

The banding stress can be the smaller, the larger the distance between the island patterns becomes. However, the island patterns must substantially perform a function of an insulation layer. In view of these points, the distance between the island patters is preferably set to a range of 2~30 μm.

Figure 2B:
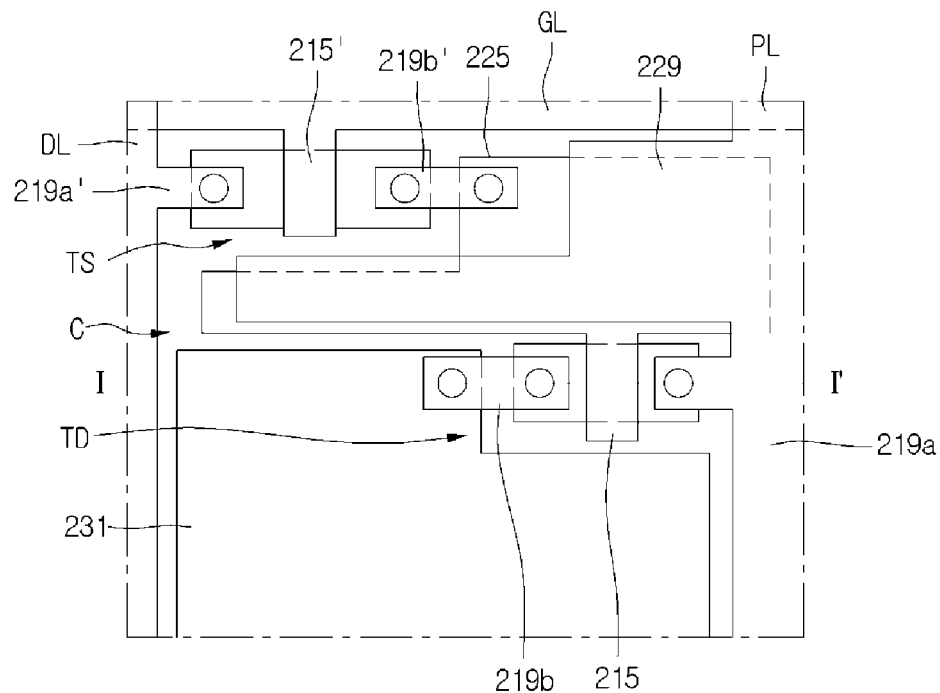
FIG. 2B is an enlarged planar view largely showing a portion A of FIG. 2A.

FIG. 2B is an enlarged planar view largely showing a portion A of FIG. 2A. In other words, FIG. 2B is a planar view illustrating in detail the portion A in the equivalent circuit diagram of FIG. 2A.

As shown in FIG. 2B, a gate electrode 215' of the switching thin film transistor TS is connected to the gate line GL. A source electrode 219a' of the switching thin film transistor TS is connected to the data line DL. A drain electrode 219b' of the switching thin film transistor TS is connected to a gate electrode 215 of the driving thin film transistor TD and the storage capacitor C.

A source electrode 219a of the driving thin film transistor TD is connected to the power supply line PL. A drain electrode 219b of the driving thin film transistor TD is connected to a first electrode of the organic light emitting diode E.

The storage capacitor C includes an upper electrode 229 connected to the power supply line PL and a lower electrode 225 connected to the gate electrode 215 of the driving thin film transistor TD. Also, the lower electrode 225 is connected to the drain electrode 219b' of the switching thin film transistor TS.

The switching thin film transistor TS is turned-on when a scan pulse is applied to the gate line GL. The turned-on switching thin film transistor TS transfers a data signal applied to the data line DL toward the storage capacitor C and the gate electrode 215 of the driving thin film transistor TD. The driving thin film transistor TD replies to the data signal applied to its gate electrode 215 and controls a current flowing from the power supply line PL toward the organic light emitting diode E, thereby adjusting the light emission quantity of the organic light emitting diode E. Although the switching thin film transistor TS is turned-off, the voltage charged into the storage capacitor C enables not only the driving thin film transistor TD to be applied a constant current I to the organic light emitting diode E but also the light emission quantity of the organic light emitting diode E to be maintained until another data signal of the next frame is applied.

Figure 3:
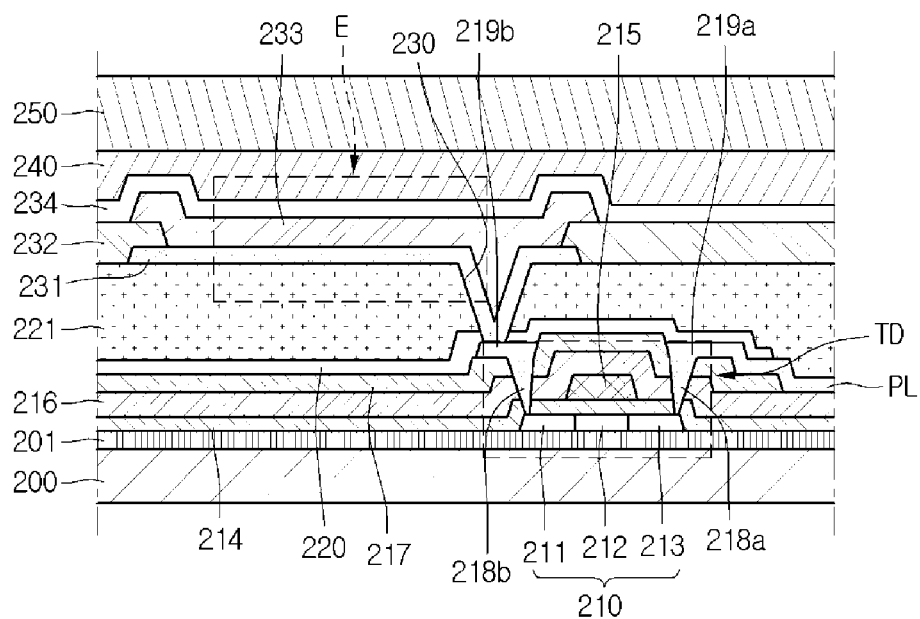
FIG. 3 is a cross-sectional view taken along a line I-I' in FIG. 2B.

FIG. 3 is a cross-sectional view taken along a line I-I'in FIG. 2B. In detail, FIG. 3 is a cross-sectional view largely showing an organic light emitting diode E and a driving thin film transistor TD of the flexible organic electroluminescent device according to a first embodiment of the present disclosure.

With reference to FIG. 3, a buffer layer 201 is entirely formed on a substrate 200. The substrate 100 can be a flexible substrate. Preferably, the substrate 200 is formed from an organic film which is adapted to unchangeably maintain properties in a high temperature. For example, the substrate 200 can be formed from at least one selected from a material group which includes acrylic, polyethylene, polypropylene, polyimide, parylene, polyethylene naphthalene (PEN), polyehtersulfone (PES), polyethylene terephthalate (PET), polycarbonate, polyester, polyurethane, polystyrene, polyacetal, mylar and other plastic materials. In the material group, polyimide has a superior mechanical property and high heat-resisting property. As such, the substrate 100 formed from polyimide can maintain thermal stability in high temperature process which is performed for forming elements later.

As the thickness of the substrate 200 is smaller, the substrate 200 becomes lighter in weight and more flexible. However, the substrate 200 must stably support layers and elements which are formed on the substrate 200. As such, the substrate 200 is preferably formed in a thickness range of about 10~100 μm.

The buffer layer 201 prevents diffusion of impurities when an active layer 210 or an organic emission layer 233 is formed later. For example, the buffer layer 201 can be a single layer formed from silicon nitride SiNx. Alternatively, the buffer layer 201 can be formed a multilayered structure (SiOx/SiNx/SiOx/SiNx/SiOx) by alternately stacking silicon oxide SiOx and silicon nitride SiNx.

The driving thin film transistor TD is formed on the buffer layer 201. Although it is not shown in the drawing, the switching thin film transistor TS (shown in FIGS. 2A and 2B) is also formed on the buffer layer 201. The driving thin film transistor TD includes an active layer 210, a gate electrode 215, a source electrode 219a and a drain electrode 219b which are formed above the buffer layer 201.

In detail, the active layer 210 is formed from polysilicon. Also, the active layer 210 includes source and drain regions 213 and 211 and a channel region 212 connected between the source and drain regions 213 and 211.

A gate insulation film 214 is formed on the entire surface of the substrate 200 provided with the active layer 210. The gate insulation film 214 can be formed from one of silicon nitride SiNx and silicon oxide $SiO_2$ which are included in an inorganic insulation material group. Preferably, the gate insulation film 214 is formed from silicon oxide $SiO_2$ standing against banding stresses.

The gate electrode 215 is formed on the gate insulation film 214 opposite to the channel region 212 of the active layer 210. Such a gate electrode 215 can be formed from one selected from a metal group consisting of MoW, Al, Cr, Ni, AlNd and Al/Cr.

First and second interlayer insulation films 216 and 217 covering the gate electrode 215 are sequentially formed on the entire surface of the substrate 200 provided with the gate electrode 215. The first interlayer insulation film 216 can be formed from silicon oxide $SiO_2$, and the second interlayer insulation film 217 can be formed from silicon nitride SiNx.

As described above, the second interlayer insulation film 217 is patterned into each sub-pixel. As such, the second interlayer insulation film 217 within each of the sub-pixel regions can have an island pattern shape. In other words, the second interlayer insulation film 217 can be patterned into an island pattern opposite to each of the sub-pixels.

First and second contact holes 218a and 218b each penetrating through the second interlayer insulation film 217, the first interlayer insulation film 216 and the gate insulation film 215 are formed. The source region 213 of the active layer 210 is exposed through the first contact hole 218a, and the drain region 211 of the active layer 210 is exposed through the second contact hole 218b. The source electrode 219a is electrically connected to the exposed source region 213 through the first contact hole 218a, and the drain electrode 219b is electrically connected to the exposed drain region 211 through the second contact hole 218b. Such source and drain electrodes 219a and 219b can be formed from a metal such as Ti/Al or Ti/Al/Ti.

The source electrode 219a is connected to the power supply line PL. The driving thin film transistor TD connected to the power supply line PL is used to control a current flowing toward the first electrode 231 of the organic light emitting diode E. The power supply line PL is used to commonly transfer a power supply voltage Vdd to the plurality of sub-pixels.

Although it is explained that the driving thin film transistor TD is formed in a coplanar structure, the present disclosure is not limited to this. In other words, the driving thin film transistor Td can be formed in one of all thin film transistor structures known up to the present. For example, the driving thin film transistor TD can be formed in an inverted coplanar structure, a staggered structure, an inverted staggered structure or one of equivalent structure thereof.

A passivation film 220 and a planarization film 221 are sequentially formed on the entire surface of the substrate 200 provided with the driving thin film transistor TD. Also, a drain contact hole 230 sequentially penetrating through the planarization film 221 and the passivation film 220 is formed. The drain contact hole 230 exposes a part of the drain electrode 219b. The passivation film 220 is formed from silicon nitride SiNx. Also, the passivation film 220 is patterned into an island pattern opposite to each sub-pixel, like the second interlayer insulation film 217. In other words, the passivation film 220 within each of the sub-pixel regions has an island pattern shape.

In this way, the present disclosure allows the second interlayer insulation film 217 and the passivation film 220 to be patterned into the sub-pixel regions. In other words, the silicon nitride (SiNx) films (or layers) easy to crack in a banding process is patterned into the sub-pixel regions. In accordance therewith, the banding property of the flexible organic electroluminescent device can be enhanced.

A first electrode 231 is formed on the planarization film 221. The first electrode 231 is electrically connected to the drain electrode 219b of the driving thin film transistor TD via the drain contact hole 230.

The first electrode 231 can be used as an anode electrode. In this case, the first electrode 231 can be formed from one selected from a transparent electrode material group which includes ITO (indium-tin-oxide), ITO/Ag, ITO/Ag/ITO, and ITO/Ag/IZO (indium-zinc-oxide), but it is not limited to these transparent electrode materials. ITO can form a transparent conductive film which allows a hole injection barrier to an organic emission layer 233 to be lowered.

An organic bank film 232 defining the sub-pixels is formed on the planarization film 221 provided with the first electrode 231. The organic bank film 232 clearly distinguishes boundaries between the red, green and blue sub-pixel regions R, G and B so that emission boundaries between the sub-pixels are clearly defined. Also, the organic bank film 232 separates the first electrodes 231 of adjacent sub-pixels from each other. Such an organic bank film 232 can be formed from polyimide or others, it is not limited to this. An opening exposing a part of the first electrode 231 is formed in the organic bank film 232.

An organic emission layer 233 is formed on the first electrode 231 exposed through the opening of the organic bank film 232. A second electrode 234 is formed on the organic emission layer 233 in such a manner as to entirely cover a display area.

The organic emission layer 233 can include an emission layer EML, an electron transport layer ETL and a hole transport layer HTL. The emission layer EML emits light using excitons which are formed through recombination of electrons and holes. The electron transport layer ETL properly adjusts the drift velocity of electrons. The hole transport layer HTL properly adjusts the drift velocity of holes. Also, the organic emission layer 233 can include an electron injection layer EIL and a hole injection layer HIL. The electron injection layer EIL can enhance electron injection efficiency for the electron transport layer ETL. The hole injection layer HIL can enhance hole injection efficiency for the hole transport layer HTL.

The second electrode 234 can be used as a cathode electrode. In this case, the second electrode 234 can be formed from one selected from a metal group which includes Al, an alloy of Mg and Ag, another alloy of Mg and Ca and so on, but it is not limited to these metals.

Such an organic light emitting diode E can be formed through the sequential formation of the first electrode 232, the organic emission layer 233 and the second electrode 234.

If a voltage is applied between the first electrode 231 and the second electrode 234, the electrons injected from the second electrode 234 and the holes injected from the first electrode 231 are drifted toward the organic emission layer 233. The electrons and the holes drifted into the organic emission layer are collided and recombined with each other, thereby emitting light. This description is based on a general fact that the first electrode 231 is used as an anode electrode and the second electrode 234 is used as a cathode electrode.

Furthermore, a sealing layer 240 and a front film 250 are sequentially formed on the second electrode 234 of the organic light emitting diode E.

FIGS. 4A through 4D are cross-sectional views illustrating step-by-step a method of fabricating a flexible organic electroluminescent device according to an embodiment of the present disclosure.

Figure 4A:
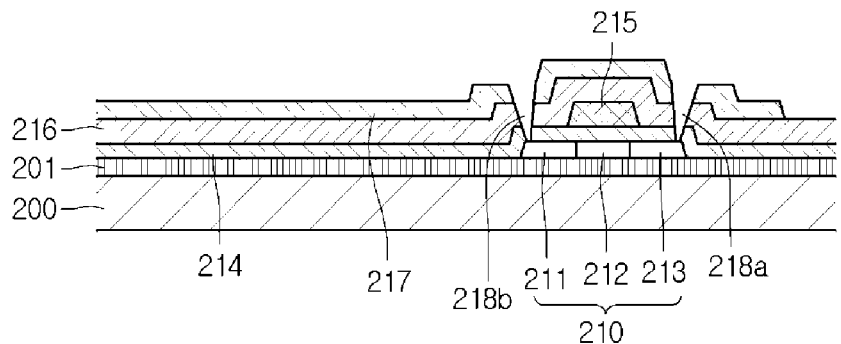
FIGS. 4A through 4D are cross-sectional views illustrating step-by-step a method of fabricating a flexible organic electroluminescent device according to an embodiment of the present disclosure.

With reference to FIG. 4A, a method of fabricating a flexible organic electroluminescent device according to a first embodiment of the present disclosure first forms a buffer layer 201 on the entire surface of a substrate 200. Thereafter, an active is formed on the buffer layer 201.

The active layer 210 can be formed through a process of forming an amorphous silicon layer, a process of crystallizing the amorphous silicon layer into a poly-silicon semiconductor layer, a process of forming a photoresist pattern on the poly-silicon semiconductor layer, a process of etching the poly-silicon semiconductor layer using the photoresist pattern as a mask, and a process of removing the photoresist pattern from the remained photo-silicon semiconductor layer. The photolithography process and the etching process can be performed before the crystallization of the amorphous silicon layer.

As examples of the crystallization of the amorphous silicon layer, one of an RTA (rapid thermal annealing) method, an SPS (solid phase crystallization) method, an ELA (eximer laser annealing) method, an MIC (metal induced crystallization) method, an MILC (metal induced lateral crystallization) method, an SGS (super grained silicon) method, an SLS (sequential lateral solidification) method, a JIC (foul heating crystallization) method and so on can be used. However, the substrate 200 formed from a plastic material must be limited to a process temperature. As such, an LTPS (low temperature poly-silicon) method can be preferably used in the formation of the poly-silicon.

The LTPS method corresponds to a technology which forms a thin film transistor (TFT) at a low temperature below 600 using a laser beam. The thin film transistor (TFT) formed using the LTPS method can be driven at a high speed and provide superior electrical properties.

A gate insulation film 214 is formed on the substrate 200 in which the active layer 210 is formed. Also, a gate electrode 215 is formed on the gate insulation film 214 opposite to the central portion of the active layer 210 by depositing a gate electrode material on the gate insulation film 214 and performing the above-mentioned photolithography and etching processes for the deposited gate electrode material.

Subsequently, an ion injection procedure for doping n+ and p+ dopants of proper quantities is performed for the substrate 200. The ion injection procedure includes a first process of forming low density regions in the active layer 210 using the gate electrode 215 as a mask and a second process of forming high density regions in the active layer 210 using a photoresist pattern, which exposes source and drain regions, as another mask. The low density regions (not shown) are used to decrease an off-current of the driving thin film transistor TD. The high density regions (not shown) become source and drain regions 213 and 211. Meanwhile, a portion of the active layer 210 shielded by the gate electrode 215 at the ion injection is used as a channel region 212. Alternatively, the gate electrode 215 instead of the photoresist pattern can be used as another mask at the formation of the high density regions.

Thereafter, first and second interlayer insulation films 216 and 217 are sequentially formed on the substrate 200 provided with the gate electrode 215. The second interlayer insulation film 217 can be formed by coating a silicon nitride material on the entire surface of the substrate 200 (i.e., on the first interlayer insulation film 216) and then island-patterning the coated silicon nitride material into sub-pixels. As such, the second interlayer insulation layer within each of the sub-pixel regions can have an island pattern shape.

It is necessary to perform a hydrogenation process for the second interlayer insulation film 217. The ploy-silicon corresponding to polycrystalline silicon and forming the active layer 210 has a plurality of traps. Due to this, electrical and photoelectrical properties of the active layer 210 such as carrier mobility, lifetime and so on can deteriorate and a leak current can be caused. If hydrogen ions are intruded into the active layer 210, the hydrogen ions are captured by the traps which exist within the active layer 210. As such, the crystalline structure of the active layer 210 can be stabilized. Also, carrier mobility and lifetime of the active layer 210 can be enhanced because the capture of carriers by the traps is prevented.

To this end, the hydrogenation process using an annealing method and so on can be performed for the second interlayer insulation film 217 after the second interlayer insulation film of a silicon nitride (SiNx) material is formed. In detail, the hydrogenation process can be performed before or after the second interlayer insulation film 217 is island-patterned.

When the patterning process for the formation of the second interlayer insulation film 217 is performed, first and second contact holes 218a and 218b penetrating through the second interlayer insulation film 217, the first interlayer insulation film 216 and the gate insulation film 214 and exposing the source and drain regions 213 and 211 are formed.

Figure 4B:
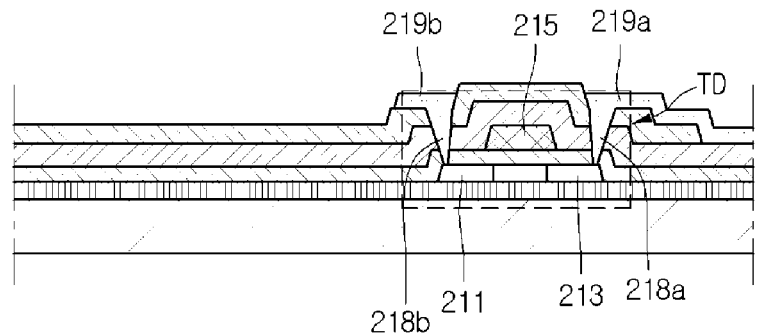

Afterward, source electrode 219a and drain electrode 219b are formed as shown in FIG. 4B. The source electrode 219a is connected to the exposed source region 213 through the first contact hole 219a, and the drain electrode 219b is connected to the exposed drain region 211 through the second contact hole 218b. Also, the source electrode 219a and the drain electrode 219b are arranged on the second interlayer insulation film 217 in such a manner as to be separated from each other with having the gate electrode 215 therebetween. Such a driving thin film transistor TD is completed through the above-mentioned processes.

Figure 4C:
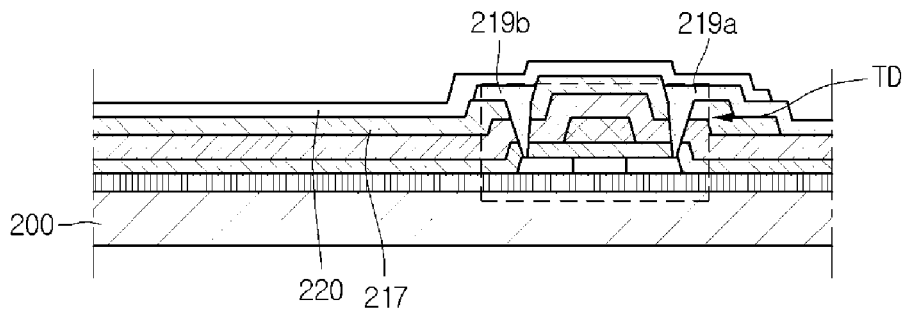

With reference to FIG. 4C, a passivation film 220 covering the source electrode 219a and the drain electrode 219b is formed. The passivation layer 220 can be formed by coating a silicon nitride (SiNx) material on the entire surface of the above-mentioned substrate 200 provided with the patterned second interlayer insulation film 217 and island-patterning the coated silicon nitride material into the sub-pixels, like the second interlayer insulation film 217. As such, the passivation film 220 within each of the sub-pixel regions can have an island pattern shape.

Figure 4D:
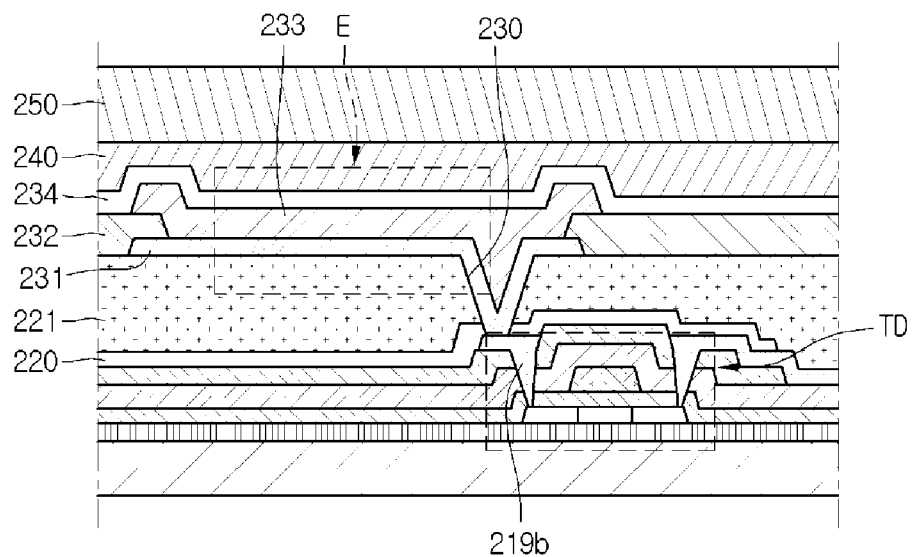

With reference to FIG. 4D, a planarization film 221 is formed on the passivation film 220, and then a drain contact hole 230 penetrating through the planarization film 221 is formed. Also, a first electrode 231 opposite to each of the sub-pixels is formed on the planarization film 221 in which the drain contact hole 230 is formed. The first electrode 231 is connected to the drain electrode 219b via the drain contact hole 230. Such a first electrode 231 can be formed by depositing a transparent conductive material on the planarization film 221 and sequentially performing a photolithography process and an etching process for the coated transparent conductive material.

Subsequently, an organic bank film 232 is formed on the substrate 200 provided with the first electrode 231. The organic bank film 232 can be formed by depositing an insulation material on the entire surface of the substrate 200 provided with the first electrode 231 and exposing a part of the first electrode 231 through a photolithography process and an etching process.

The organic bank film 232 electrically separates the first electrodes 231 of adjacent sub-pixels from each other. Such an organic bank film 232 can be formed from polyimide or others.

An organic emission layer 233 and a second electrode 234 are sequentially formed on the first electrode 231 which is exposed by the organic bank film 232. In accordance therewith, an organic light emitting diode E including the first electrode 231, the organic emission layer 233 and the second electrode 234 is completed.

Thereafter, a sealing layer 240 and a front film 250 are sequentially formed on the entire surface of the substrate 200 provided with the organic light emitting diode E. The sealing layer 240 and the front film 250 are used to prevent intrusion of moisture and/or oxygen into the organic light emitting diode E.

The sealing layer 240 can include at least one of an inorganic protective layer and an organic protective layer. The inorganic protective layer can be formed from one selected from an inorganic insulation material group which includes silicon nitride (SiNx), silicon oxide ($SiO_2$) and aluminum oxide ($Al_2O_3$) called as alumina. The organic protective layer can be formed from one selected from an organic insulation material which includes polyacrylate, polyimide, polyamide and benzocyclobutene (BCB).

The inorganic protective layer can be formed using a CVD (chemical vapor deposition) method or sputtering equipment. The organic protective layer can be formed using one of an inkjet apparatus, a nozzle coating apparatus, a bar coating apparatus, a slit coating apparatus, a spin coating apparatus and a printing apparatus.

The front film 250 is used as a member for protecting every element which includes the organic emission layer 233 and is formed through the fabrication procedure. Actually, the front film 250 can protect the elements on the substrate 200 from scratches. Such a front film 250 can be formed from a plastic material. For example, the front film 250 can be formed from one selected from a material group which includes polyethylene terephthalate, PI (polyimide), polyether sulfone, PMMA (polymethyl ethacrylate), PC (polycarbonate) and polystyrene. Particularly, the front film 250 can be formed in a multi-layered structure in order to prevent intrusion of moisture and oxygen.

The above-mentioned flexible organic electroluminescent device according to the present disclosure can be applied to not only a top emission mode but also a bottom emission mode. The top emission mode allows light emitted from the organic light emitting diode E to be output through the sealing layer 240. The bottom emission mode enables light emitted from the organic light emitting diode E to be output through the substrate 200.

Figure 5:
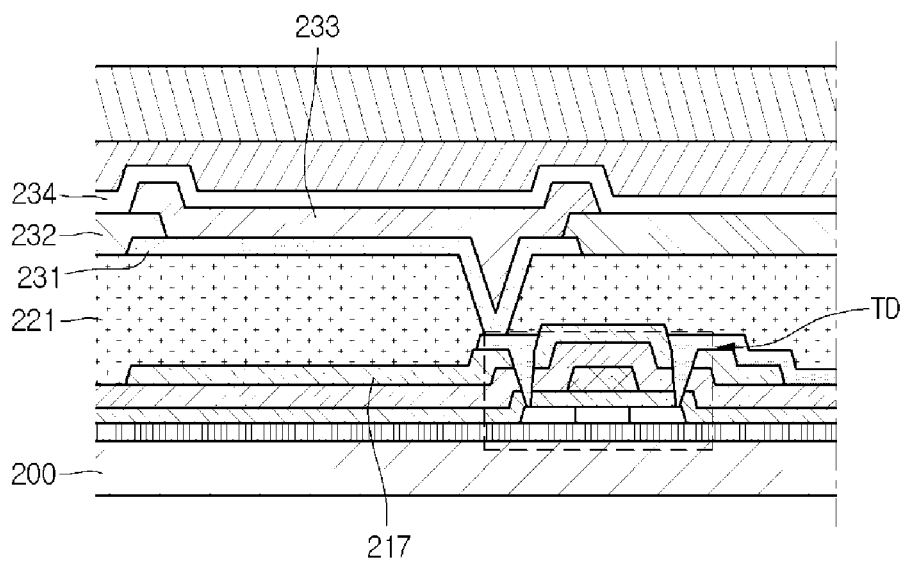
FIG. 5 is a cross-sectional view showing a flexible organic electroluminescent device according to a second embodiment of the present disclosure.

FIG. 5 is a cross-sectional view showing a flexible organic electroluminescent device according to a second embodiment of the present disclosure. In detail, FIG. 5 is a cross-sectional view largely showing an organic light emitting diode E and a driving thin film transistor TD of the flexible organic electroluminescent device according to a second embodiment of the present disclosure.

The flexible organic electroluminescent device according to a second embodiment of the present disclosure has the same configuration as that of the first embodiment with the exception that the passivation 220 (shown in FIG. 3) is removed. As such, components of the second embodiment having the same function and shape as those of the first embodiment will be referred to by the same reference numbers and names. Also, the description of the second embodiment overlapping with the first embodiment will be omitted.

With reference to FIG. 5, the flexible organic electroluminescent device according to a second embodiment includes a planarization film 221 which is directly formed on the entire surface of the substrate 200 with the driving thin film transistor TD without forming the passivation film of silicon nitride (SiNx).

A first electrode 231, an organic bank film 232, an organic emission layer 233, a second electrode 234 and so on are formed on the planarization film 221.

Figure 6:
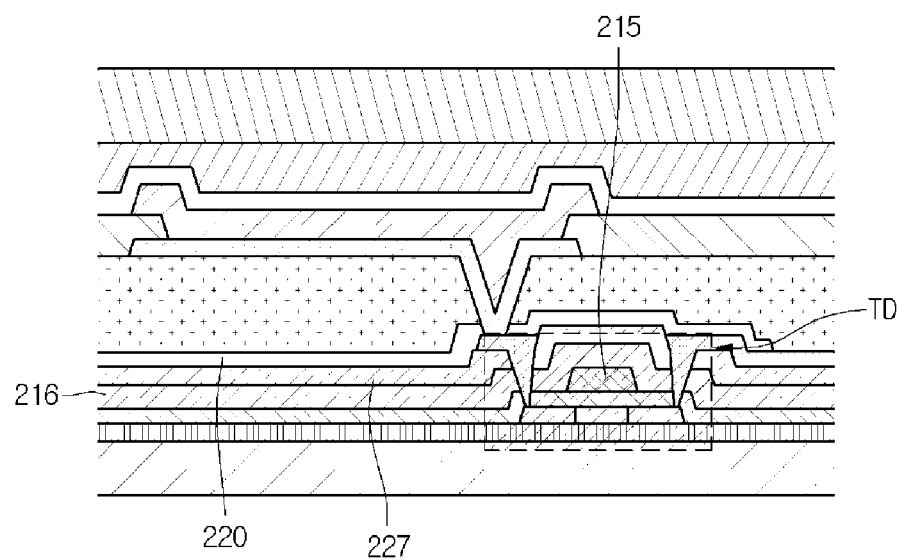
FIG. 6 is a cross-sectional view showing a flexible organic electroluminescent device according to a third embodiment of the present disclosure.

In this manner, the flexible organic electroluminescent device of the second embodiment has the same configuration as that of the first embodiment with the exception that the passivation film 220 (in FIG. 3) is removed. As such, the second interlayer insulation film 217 of silicon nitride (SiNx) is formed in a planar structure of being island-patterned into sub-pixels, like that of the first embodiment FIG. 6 is a cross-sectional view showing a flexible organic electroluminescent device according to a third embodiment of the present disclosure. In detail, FIG. 6 is a cross-sectional view largely showing an organic light emitting diode E and a driving thin film transistor TD of the flexible organic electroluminescent device according to a third embodiment of the present disclosure.

The flexible organic electroluminescent device according to a third embodiment of the present disclosure has the same configuration as that of the first embodiment with the exception that a third interlayer insulation film 227 of silicon oxide (SiOx) instead of the second interlayer insulation film 217 of silicon nitride (SiNx) is formed. As such, components of the third embodiment having the same function and shape as those of the first embodiment will be referred to by the same reference numbers and names. Also, the description of the third embodiment overlapping with the first embodiment will be omitted.

With reference to FIG. 6, the flexible organic electroluminescent device according to a third embodiment includes a first interlayer insulation film and a third interlayer insulation film 227 which are sequentially formed on the entire surface of the substrate 200 provided with the gate electrode 215.

The third interlayer insulation film 227 is formed from silicon oxide (SiOx). In other words, the interlayer insulation film is configured with double layers (i.e., the first and third interlayer insulation films 216 and 227) which are formed from silicon oxide (SiOx). The third interlayer insulation film 227 is not patterned into the sub-pixels, unlike the second interlayer insulation film 217 (shown in FIG. 3) of the first embodiment. This results from the fact that the third interlayer insulation film 227 of silicon oxide (SiOx) stands against banding stresses.

The flexible organic electroluminescent device of the third embodiment includes a passivation film 220 formed from silicon nitride (SiNx), like that of the first embodiment. The passivation film 220 is also formed in a planar structure of being island-patterned into sub-pixels.

It will be apparent to those skilled in the art that various modifications and variations can be made in the flexible organic electroluminescent device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of a flexible organic electroluminescent device, the method comprising:
    forming a buffer layer on an entire surface of a flexible substrate;
    forming a thin film transistor with an active layer on the buffer layer and including at least one silicon nitride layer, the at least one silicon nitride layer being patterned into a plurality of island patterns;
    forming a planarization film on the entire surface of the flexible substrate provided with the thin film transistor; and
    forming an organic light emitting diode, which includes a first electrode, an organic emission layer and a second electrode, on the planarization film.

2. The method of claim 1, wherein a distance between the island patterns is in a range of about 2-30 μm.

3. The method of claim 2, wherein a shape of the island pattern depends on a sub-pixel shape.

4. The method of claim 3, wherein a distance between the island patterns is in a range of about 2-30 μm.

5. The method of claim 1, wherein the formation of the thin film transistor further includes:
    forming a gate insulation film on the entire surface of the flexible substrate provided with the active layer;
    forming a gate electrode on the gate insulation film;
    forming a first interlayer insulation film of silicon oxide (SiOx) on the entire surface of the flexible substrate provided with the gate electrode; and
    forming source and drain electrodes on the first interlayer insulation film, the formation of at least one silicon nitride layer being performed between the formation of the first interlayer insulation film and the formation of the source and drain electrodes.

6. The method of claim 5, wherein the at least one silicon nitride layer further includes a passivation film formed between the source and drain electrodes and the planarization film.

7. The method of claim 6, further comprises forming a sealing layer on the entire surface of the flexible substrate provided with the organic light emitting diode.

8. The method of claim 7, further comprises forming a front film on the sealing layer.

9. The method of claim 8, wherein the front film is formed from one selected from a material group which includes polyethylene terephthalate, PI (polyimide), polyether sulfone, PMMA (polymethyl ethacrylate), PC (polycarbonate) and polystyrene.

10. The method of claim 1, wherein the formation of the thin film transistor further includes:
    forming a gate insulation film on the entire surface of the flexible substrate provided with the active layer;
    forming a gate electrode on the gate insulation film;
    forming an interlayer insulation film of silicon oxide (SiOx) in a double-layered structure on the entire surface of the flexible substrate provided with the gate electrode; and
    forming source and drain electrodes on the interlayer insulation film, the formation of at least one silicon nitride layer being performed between the formation of the source and drain electrodes and the formation of the planarization film.

11. The method of claim 1, wherein the formation of the thin film transistor further includes:
    forming a gate insulation film on the entire surface of the flexible substrate provided with the active layer;
    forming a gate electrode on the gate insulation film;
    forming a first interlayer insulation film of silicon oxide (SiOx) on the entire surface of the flexible substrate provided with the gate electrode;
    forming the at least one silicon nitride layer including at least a second interlayer insulation film on the first interlayer insulation film; and
    forming source and drain electrodes on the at least one silicon nitride layer.

12. The method of claim 11, wherein the at least one silicon nitride layer further includes a passivation film formed between the source and drain electrodes and the planarization film.

13. The method of claim 1, wherein the formation of the thin film transistor further includes:

forming a gate insulation film on the entire surface of the flexible substrate provided with the active layer;

forming a gate electrode on the gate insulation film;

forming an interlayer insulation film of silicon oxide (SiOx) in a double-layered structure on the entire surface of the flexible substrate provided with the gate electrode;

forming source and drain electrodes on the interlayer insulation film; and forming the at least one silicon nitride layer including at least a passivation film on the source and drain electrodes to be between the source and drain electrodes and the planarization film.

14. The method of claim 1, wherein the at least one nitride layer is formed above the active layer but under the planarization layer.

15. The method of claim 11, wherein the at least one silicon nitride layer is between the active layer and the planarization film.

* * * * *